(12) United States Patent
Higuchi (10) Patent No.: US 7,733,168 B2
(45) Date of Patent: Jun. 8, 2010

(54) FULLY DIFFERENTIAL COMPARATOR AND FULLY DIFFERENTIAL AMPLIFIER

(75) Inventor: Masahiro Higuchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 98 days.

(21) Appl. No.: 12/092,675

(22) PCT Filed: Aug. 31, 2006

(86) PCT No.: PCT/JP2006/317238

§ 371 (c)(1),
(2), (4) Date: May 5, 2008

(87) PCT Pub. No.: WO2007/058011

PCT Pub. Date: May 24, 2007

(65) Prior Publication Data

US 2009/0179699 A1      Jul. 16, 2009

(30) Foreign Application Priority Data

Nov. 21, 2005   (JP) ............................. 2005-335415

(51) Int. Cl.
*H03F 1/02* (2006.01)
(52) U.S. Cl. .......................................... 330/9; 330/69
(58) Field of Classification Search .............. 330/9, 330/69; 327/124, 307
See application file for complete search history.

(56) References Cited

U.S. PATENT DOCUMENTS 4,965,468 A * 10/1990 Nicollini et al. ............... 327/89
5,565,800 A    10/1996 Kobayashi
6,326,846 B1 * 12/2001 Brandt ......................... 330/253
2002/0196054 A1  12/2002 Ohkido

FOREIGN PATENT DOCUMENTS

| JP | 7-43397 | 2/1995 |
|---|---|---|
| JP | 10-107600 | 4/1998 |
| JP | 11-150454 | 6/1999 |
| JP | 2002-374153 | 12/2002 |

* cited by examiner

*Primary Examiner*—Henry K Choe
(74) *Attorney, Agent, or Firm*—McDermott Will & Emery LLP (57) ABSTRACT

A first to a fourth sampling switch (1*a* to 1*d*), a first to a fourth sampling capacitance (4 to 7), and a first and a second charge redistribution switch (2*a*, 2*b*) are provided on the input side of a differential amplifier (8). A first and a second reset switch (3*a*, 3*b*) are provided between inputs and outputs of the differential amplifier (8). A positive-polarity input signal voltage (Vinp), a negative-polarity comparison reference voltage (Vrefn), a positive-polarity comparison reference voltage (Vrefp), and a negative-polarity input signal voltage (Vinn) are applied via the first to fourth sampling switches (1*a* to 1*d*) to one ends of the first to fourth sampling capacitances (4 to 7), respectively. During a reset period, the reset of the differential amplifier (8) is released after sampling of the voltages. During a comparison period, the first and second charge redistribution switches (2*a*, 2*b*) are caused to be in a conduction state.

12 Claims, 4 Drawing Sheets

FIG. 4

FULLY DIFFERENTIAL COMPARATOR AND FULLY DIFFERENTIAL AMPLIFIER

RELATED APPLICATIONS

This application is the U.S. National Phase under 35 U.S.C. §371 of International Application No. PCT/JP2006/317238, filed on Aug. 31, 2006, which in turn claims the benefit of Japanese Patent Application No. JP 2005-335415, filed on Nov. 21, 2005, the disclosures of which Applications are incorporated by reference herein.

TECHNICAL FIELD

The present invention relates to a technique for allowing high-precision comparison and amplification of a differential input signal with low power consumption, particularly under conditions for a high-speed operation, in a fully differential analog signal processing circuit having a wide dynamic range.

BACKGROUND ART

In recent years, there is an increasing demand for a low-voltage, high-speed, and low-power-consumption analog signal processing circuit. Therefore, the use of a technique has recently become a main stream in which a switched capacitor arrangement which is a combination of a CMOS analog circuit amplifier and a capacitor is employed to secure a dynamic range and enable a high-speed operation using a low power supply voltage.

On the other hand, regarding analog-digital interface techniques, ADCs (analog-to-digital converters) for general-purpose applications which have higher performance, such as an improved resolution, higher speed and the like, have been developed. Therefore, the performance of analog processing before the ADC is critical to the system performance.

For example, in an analog front-end circuit of a camera module of a mobile telephone, an increase in processing speed with an increase in the number of pixels in an image sensor, the expansion of the dynamic range, or an improvement in precision of analog signal processing with an increase in the number of bits of the ADC leads to a deterioration in image quality during low-illuminance shooting, for example, when a black level offset is insufficiently removed, so that it is important to increase the precision of a comparator for detecting a black level offset.

Specifically, for example, in an 10-bit ADC having a dynamic range of 1 V, the quantization level of the ADC is smaller than 1 mV, so that an offset of as small as about 60 μV cannot be tolerated in the input section, taking into consideration the amplification factor of the analog front-end.

As the product range of such a camera module project, the field of surveillance cameras, such as security cameras, in-car cameras and the like, has currently attracted attention, and advanced technologies have been developed.

Particularly, in in-car cameras, an improvement in sensitivity of an image sensor, a high amplification factor, a wide dynamic range, and high-precision analog signal processing are required so as to enhance the nighttime surveillance capability. Whereas higher performance has been desired mainly for the purpose of an improvement in image quality of still images in mobile telephone cameras or digital cameras, an even higher-speed operation is required for real-time processing of moving images. Further, it is easily expected that the number of pixels in an image sensor mounted is increased.

Therefore, it is considered that a technique of processing a differential analog signal having a wide dynamic range with high precision and high speed will be required in the future, and in addition, more importance will be put on lower power consumption with further penetration of hybrid cars, an increase in in-car electronic apparatuses, or the like.

To date, the following techniques have been known as techniques relating to fully differential comparators and amplifier circuits.

A first conventional technique is such that an input portion of a comparator is configured at a differential input stage to detect a difference by successively switching a voltage to be applied to a chopper capacitance between a differential comparison reference voltage and a differential input signal voltage using a switch (see Patent Document 1).

A second conventional technique is such that a differential comparison reference voltage and a differential input signal voltage are input to the gate of a differential comparison stage transistor by DC connection without using a chopper capacitance, and both the voltages are short-circuited using a switch at each of positive and negative sides, thereby detecting a difference (see Patent Document 2).

A third conventional technique is such that an input portion of a comparator is configured so that capacitances for separately sampling an input signal voltage and a comparison reference voltage are connected in parallel to positive and negative sides of a differential so that, during a comparison operation, both positive-and negative-side voltages are short-circuited using a switch to detect a difference (see Patent Document 3).

Patent Document 1: Japanese Unexamined Patent Application Publication No. H10-107600
Patent Document 2: Japanese Unexamined Patent Application Publication No. H11-150454
Patent Document 3: Japanese Unexamined Patent Application Publication No. 2002-374153

DISCLOSURE OF THE INVENTION

Problems to be Solved by the Invention

The first conventional technique is a general fully differential comparator arrangement. Regarding a high-speed operation, the settling time of a comparison output varies depending on the drive power of a circuit at a preceding stage which supplies the differential comparison reference voltage and the differential input signal voltage in the case of some chopper capacitances. Therefore, during a high-speed operation, a drive portion for the preceding-stage circuit requires a larger amount of current, which is a disadvantage in terms of power consumption. Also, when a differential input signal considerably close to the differential comparison reference voltage is compared, charge injection during switching to accumulation of charges in a chopper capacitance or a feedthrough offset of the switch is asymmetrical, depending on the difference between positive and negative voltage levels, so that an error is not canceled, resulting in a deterioration in comparison precision.

An offset is generated by a parasitic capacitance of a switch transistor, and the technique of canceling the offset in a switch portion is known and has been generally put into practical use. However, this technique is lack of removal precision of the order of microvolts as described above, so that it is particularly difficult to eliminate the asymmetry of the differential.

In addition, in the first conventional technique, the timing of sampling the differential comparison reference voltage and the differential input signal voltage is shifted between in the positive side and in the negative side. This is considered to be based on the assumption that the positive signal amplitude and the negative signal amplitude are compared rather than the differential amplitude. In such a case, if common-mode noise is contained in a signal to be compared, a difference in sampling time eliminates simultaneity, so that correlation cannot be performed, and therefore, the noise removal effect is impaired.

Also, in the second conventional technique, when the differential comparison stage is comprised of an N-channel transistor, the input voltage range is limited on the low-voltage side. When the differential comparison stage is comprised of a P-channel transistor, the input voltage range is limited on the high-voltage side. In other words, a signal dynamic range to be processed is limited to an input range within which the differential comparison stage can be operated, and therefore, the second conventional technique is not suitable for signal processing within a wide dynamic range.

These problems will be, in the future, important technical problems for applications in which higher speed, higher precision, and a wider dynamic range will be required.

On the other hand, the third conventional technique is a method for solving these problems. Specifically, the deterioration of the common-mode noise removal performance which is a problem with the first conventional technique can be avoided by the input signal voltage and the comparison reference voltage being simultaneously sampled by the capacitances connected in parallel thereto. Regarding the limitation on the dynamic range which is a problem with the second conventional technique, an input signal is input via the sampling capacitance to the differential comparison stage, so that the DC voltage range of the input signal is not limited.

However, the third conventional technique is insufficient for the above-described high-performance differential analog signal processing in some respects. For example, in the third conventional technique, an inverter amplifier is used as a differential comparison stage in each of the positive and negative sides. After a comparison operation, the output of one of the inverter amplifiers is fed back to the input of the other, and vice versa, so that the comparison result is held, which is a latch function. Therefore, the comparison result is invariably caused to have a binary value. In other words, only a relationship in magnitude between the input signal voltage and the comparison reference voltage is output as a result. Therefore, an analog output indicating the magnitude of the difference cannot be obtained. Therefore, the third conventional technique cannot be used in, for example, an application in which the black level offset of an image sensor is removed by an analog front-end circuit. Specifically, if a black level signal and a reference black level are compared with each other and an offset removal amount is controlled by feedback based on the comparison result, then when the binary result is fed back, a response is excessively quick during a process in which the offset is removed and converged, so that oscillation is highly likely to occur.

Another problem is that, in a switching operation sequence of the third conventional technique, when the switch is turned OFF after the input signal voltage and the comparison reference voltage are sampled, the latch and reset of the inverter amplifiers have already been released, and therefore, the inputs of the inverter amplifiers are in the floating state. Specifically, at the moment when the switch is turned OFF upon the end of sampling of the input signal voltage and the comparison reference voltage, a variation in charge injection due to a gate-source parasitic capacitance of a switch transistor is propagated to the inputs of the inverter amplifiers, so that a comparison operation is performed at operating points which are deviated from original operating points of the inverter amplifiers, where these deviations cannot be correlated between the inverter amplifiers on both the positive and negative sides. As a result, when the gain of the inverter amplifier is high, a deterioration in symmetry of comparison results on the positive and negative sides or an erroneous operation of comparison is likely to occur.

The present invention provides a fully differential comparator which is directed to all applications that require fully differential analog signal processing with high speed, high precision, and a wide dynamic range, and which, in order to solve the above-described problems, can output a comparison result corresponding to the magnitude of a difference between an input signal voltage and a comparison reference voltage, and can be stably operated with high precision, and in which low power consumption can be easily achieved. The present invention also provides a fully differential amplifier circuit to which the comparator technique is applied.

Solution to the Problems

To solve the above-described problems, the present invention firstly employs a differential amplifier which has a high DC gain and provides an output amplitude corresponding to a comparison difference as a comparator. Next, the present invention provides an arrangement which eliminates the necessity of driving by a preceding-stage circuit during a comparison period and an amplification period which prevents an increase in high speed. Specifically, the speed of conventional operations during a comparison period and an amplification period can be increased by avoiding the influence of an output impedance of the preceding-stage circuit which affects transient response characteristics of a comparison result output and an amplification result output. To achieve this, all voltages of the preceding-stage circuit need to be simultaneously sampled during a reset period, and difference comparison needs to be performed with the preceding-stage circuit is disconnected during a comparison period and an amplification period. Therefore, in the present invention, capacitances are separately provided for sampling of both positive and negative differential input signal voltages and positive and negative differential comparison reference voltages, i.e., a total of four sampling capacitances are provided.

Also, in order to reduce an output settling time, a method of using quick time response of charge redistribution is provided. Specifically, the sampling capacitances are divided into two groups, each of which is connected in common to a corresponding one of the positive-and negative-polarity input terminals of the differential amplifier, so that there are two sets of a combination of a positive-polarity side capacitance terminal and a negative-polarity side capacitance terminal which define signal amplitudes to be compared. Both the terminals are short-circuited by a charge redistribution switch for each set to perform comparison, amplification and output. Thereby, a required variation width of an input is an amplitude variation which is about a half of a differential input signal voltage width due to charge redistribution in the present invention, though an amplitude of a differential input signal voltage needs to be driven by the preceding-stage circuit to obtain an input variation width required for a comparison period and an amplification period.

Further, regarding an increase in precision, reasons why comparison precision of a differential input signal voltage in the vicinity of a differential comparison reference voltage is particularly impaired are charge injection during switching of a switch caused by successive sampling during reset and comparison periods, and a feedthrough offset amount of a switch differs when a difference positive and negative differential comparison reference voltage levels is large, in conventional methods. Charge injection can be removed as common-mode noise by using a simultaneous sampling method. Also, an erroneous comparison operation can be prevented by a sequence in which the reset of the differential amplifier is canceled after the end of sampling. Also, in order to solve the feedthrough offset problem, a combination of a positive-polarity voltage and a negative-polarity voltage is used as a combination of capacitances connected in common to the input terminals having both polarities of the differential amplifier. Specifically, regarding differential input signal voltages in the vicinity of the differential comparison reference voltage, a positive signal voltage has a voltage level close to the positive comparison reference voltage and a negative signal voltage has a voltage level close to the negative comparison reference voltage. Therefore, a combination of capacitances involved with signals having levels different from each other is connected in common to the input of the differential amplifier, thereby achieving a function of overcoming an error due to the asymmetry of a feedthrough offset by charge redistribution of a comparison operation.

Effect of the Invention

According to the comparator of the present invention, the preceding-stage circuit does not need to be driven for an operation during a comparison period, so that there is not an increase in power consumption of driving of a signal during a high-speed operation. Also, when a difference between differential input signals is detected, or particularly when a differential input signal voltage having a small amplitude considerably close to a differential comparison reference voltage is compared, high-precision difference detection which is not possible in the conventional art can be achieved. For example, the present invention has a high advantage for an application in which a small offset of a differential input signal is detected with high precision.

Further, by applying the comparator technique of the present invention to an amplifier circuit, the offset reduction effect after an amplification process with a high amplification factor is enhanced. Also, the arrangement obtained by adding switches and capacitances is simple, advantageously resulting in low cost.

Also, according to the present invention, a combination of capacitance terminals connected to the input terminals of a differential amplifier and a combination of capacitance terminals to be short-circuited during a comparison period and an amplification period can be changed, depending on the signal comparison method. Therefore, simultaneity can be certainly correlated, resulting in fully differential analog signal processing having high common-mode noise resistance and high quality.

DESCRIPTION OF THE REFERENCE CHARACTERS 1, 1a to 1d sampling switch
2 comparison switch
2a, 2b charge redistribution switch
3a, 3b reset switch
4 to 7 sampling capacitance
8 differential amplifier
9, 10 feedback capacitance
11, 12 chopper capacitance
13a, 13b output reference voltage application switch
14a, 14b feedback switch
15 common-mode feedback circuit
Cf capacitance value of feedback capacitance
Cs capacitance values of sampling capacitance and chopper capacitance
Va+, Va− input terminals (positive-polarity, negative-polarity) of differential amplifier
Vcm input common voltage
Vinp, Vinn differential input signal voltage (positive-polarity, negative-polarity)
Vo+, Vo− output terminal (positive-polarity, negative-polarity) of differential amplifier
Vrefp, Vrefn differential comparison reference voltage (positive-polarity, negative-polarity)
Vrefpo, Vrefno differential output reference voltage (positive-polarity, negative-polarity)
Φ1, Φ1a, Φ2 switch control signal

BEST MODE FOR CARRYING OUT THE INVENTION

Hereinafter, embodiments of the present invention will be described with reference to the accompanying drawings.

Figure 1:
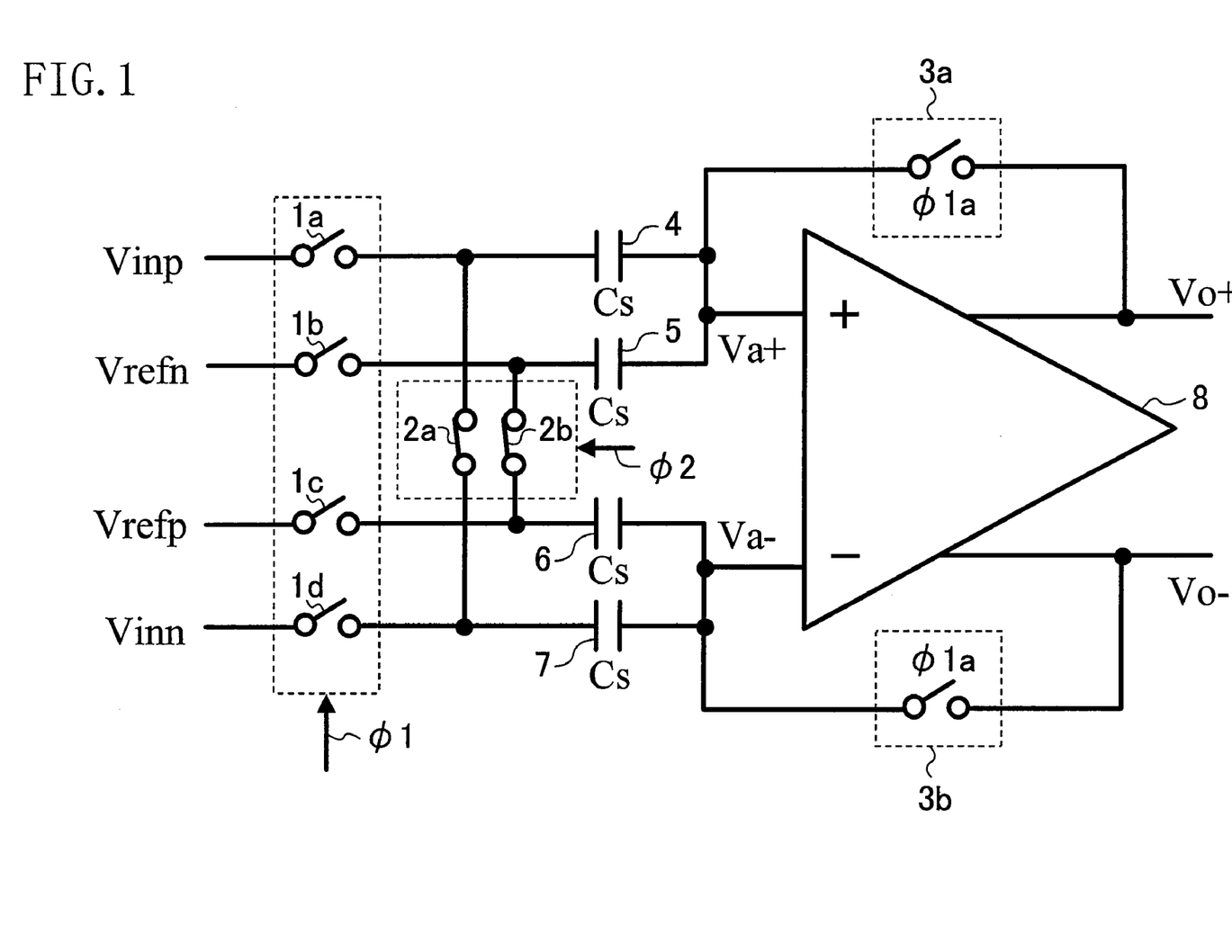
FIG. 1 is a circuit diagram showing an exemplary configuration of a fully differential comparator according to the present invention.

FIG. 1 shows an exemplary configuration of a fully differential comparator according to the present invention. In FIGS. 1, 1a, 1b, 1c and 1d indicate first to fourth sampling switches, 2a and 2b indicate first and second charge redistribution switches, 3a and 3b indicate first and second reset switches, 4, 5, 6 and 7 indicate first to fourth sampling capacitances, and 8 indicates a differential amplifier. Also, Vinp and Vinn represents differential input signal voltages, Vrefp and Vrefn represents differential comparison reference voltages, Va+ and Va− indicate positive-and negative-polarity input terminals of the differential amplifier 8, and Vo+ and Vo− indicate positive-and negative-polarity output terminals of the differential amplifier 8. The first to fourth sampling capacitances 4 to 7 substantially all have the same capacitance value Cs. Φ1, Φ1a and Φ2 indicate first to third switch control signals for controlling ON/OFF of the respective switches of FIG. 1. Note that the state of FIG. 1 indicates the ON/OFF state of each switch during a comparison period.

In FIG. 1, the positive-polarity input signal voltage Vinp is applied via the first sampling switch 1a to one end of the first sampling capacitance 4. The negative-polarity comparison reference voltage Vrefn is applied via the second sampling switch 1b to one end of the second sampling capacitance 5. The other end of the first sampling capacitance 4 and the other end of the second sampling capacitance 5 are connected in common to the positive-polarity input terminal Va+ of the differential amplifier 8. The positive-polarity comparison reference voltage Vrefp is applied via the third sampling switch 1c to one end of the third sampling capacitance 6. The negative-polarity input signal voltage Vinn is applied via the fourth sampling switch 1d to one end of the fourth sampling capacitance 7. The other end of the third sampling capacitance 6 and the other end of the fourth sampling capacitance 7 are connected in common to the negative-polarity input terminal Va− of the differential amplifier 8. Further, the first charge redistribution switch 2a is interposed between a connection point of the first sampling switch 1a and the first sampling capacitance 4 and a connection point of the fourth sampling switch 1d and the fourth sampling capacitance 7, and the second charge redistribution switch 2b is interposed between a connection point of the second sampling switch 1b and the second sampling capacitance 5 and a connection point of the third sampling switch 1c and the third sampling capacitance 6. The first reset switch 3a is interposed between the positive-polarity output terminal Vo+ and the positive-polarity input terminal Va+ of the differential amplifier 8, and the second reset switch 3b is interposed between the negative-polarity output terminal Vo− and the negative-polarity input terminal Va− of the differential amplifier 8. The ON/OFF of the first to fourth sampling switches 1a to 1d is controlled in accordance with the first switch control signal Φ1, the ON/OFF of the first and second reset switches 3a and 3b is controlled in accordance with the second switch control signal Φ1a, and the ON/OFF of the first and second charge redistribution switches 2a and 2b is controlled in accordance with the third switch control signal Φ2.

Figure 2:
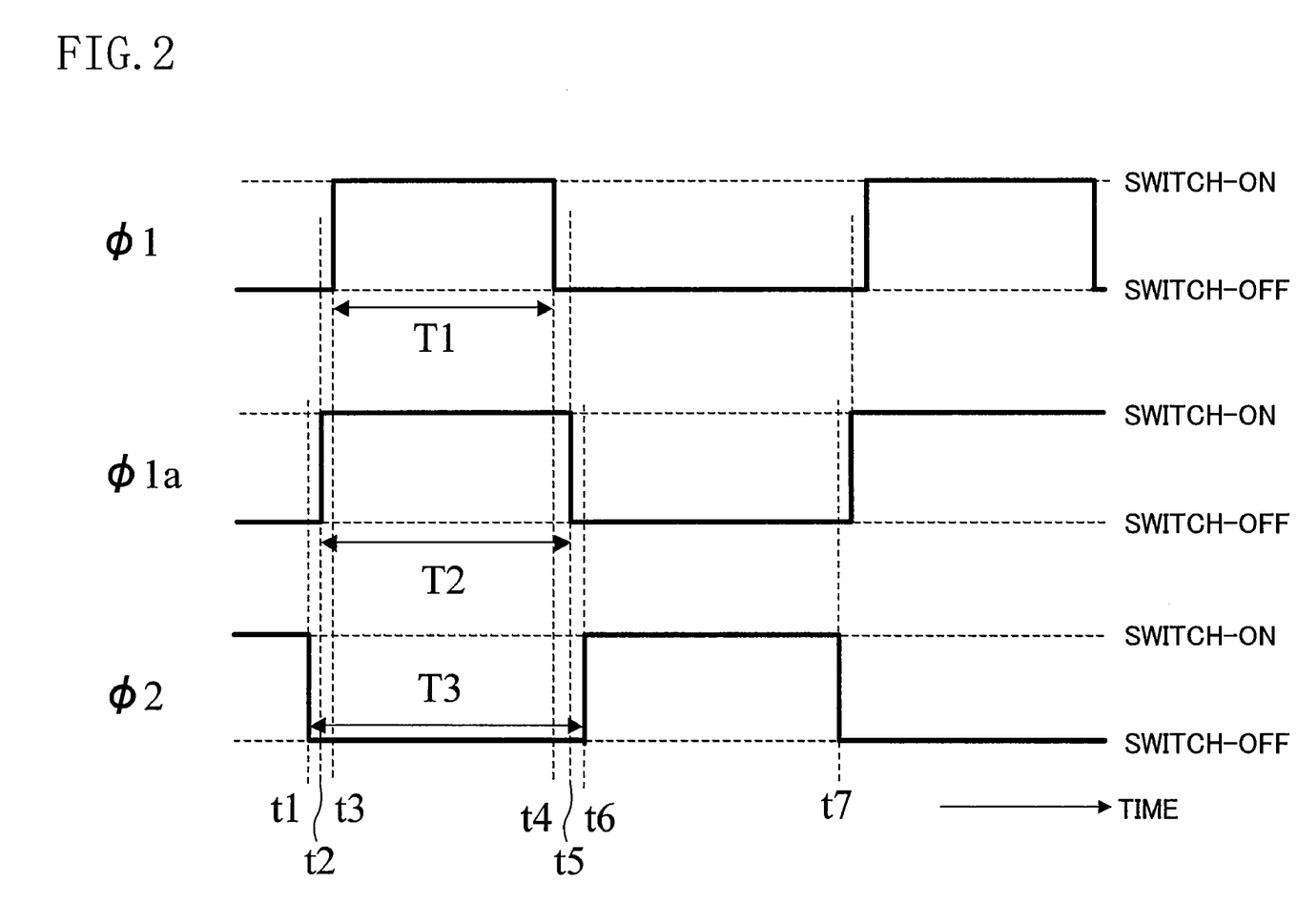
FIG. 2 is a timing diagram of switch control signals of FIG. 1.

FIG. 2 is a timing diagram of the first to third switch control signals Φ1, Φ1a and Φ2 of FIG. 1. During a period of time T1 from time t3 to time t4, the first switch control signal Φ1 indicates the H level, so that the first to fourth sampling switches 1a to 1d are in the conduction state. During a period of time T2 from time t2 to time t5, the second switch control signal Φ1a indicates the H level, so that the first and second reset switches 3a and 3b are in the conduction state. During a period of time T3 from time t1 to time t6, the third switch control signal Φ2 indicates the L level, so that the first and second charge redistribution switches 2a and 2b are in the nonconduction state. During a period of time from time t6 to time t7, the third switch control signal Φ2 indicates the H level, so that the first and second charge redistribution switches 2a and 2b are in the conduction state. The period of time from time t2 to time t5 is a reset period, and the period of time form time t6 to time t7 is a comparison period.

Next, an operation of the fully differential comparator of FIG. 1 will be described with reference to FIG. 2. Initially, at time t1, a comparison period is ended, and the first and second charge redistribution switches 2a and 2b are opened. Thereby, all of the switches of FIG. 1 are caused to be the nonconduction state. At time t2, the differential amplifier 8 goes into a reset period, and the first and second reset switches 3a and 3b are closed, so that Va+ and Vo+, and Va− and Vo− are biased by a reset voltage Va. Thereafter, at time t3, the first to fourth sampling switches 1a to 1d are closed, and the differential input signal voltages Vinp and Vinn and the differential comparison reference voltages Vrefp and Vrefn simultaneously start to be sampled. At time t4, the sampling is ended. In this case, at the moment when the first to fourth sampling switches 1a to 1d are opened, charge injection occurs. However, since the first and second reset switches 3a and 3b are closed, the input terminals Va+ and Va− of the differential amplifier 8 are both stable, and therefore, Va+ and Va− do not vary due to an influence of charge injection via a capacitance.

Charges accumulated in the first to fourth sampling capacitances 4 to 7 at this point in time are calculated for the input terminals Va+ and Va− of the differential amplifier 8. Here, the charge of the positive-polarity input terminal Va+ is represented by Q(Va+), and the charge of the negative-polarity input terminal Va− is represented by Q(Va−). Note that it is assumed that Vinn is close to Vrefn, and Vinp is close to Vrefp. A feedthrough offset in the vicinity of Vrefn is represented by ΔVn, and a feedthrough offset in the vicinity of Vrefp is represented by ΔVp. In this case, the following expressions are satisfied.

$Q(Va+) = Cs(Va - Vinp + \Delta Vp) + Cs(Va - Vrefn + \Delta Vn)$ $Q(Va-) = Cs(Va - Vrefp + \Delta Vp) + Cs(Va - Vinn + \Delta Vn)$ (note that $\Delta Vp \neq \Delta Vn$)

Next, at time t5, the first and second reset switches 3a and 3b are opened. At time t6, the first and second charge redistribution switches 2a and 2b are closed, and a comparison period is then started. During this comparison period, a voltage when the first sampling capacitance 4 and the fourth sampling capacitance 7 are short-circuited is represented by Vi, and a voltage when the second sampling capacitance 5 and the third sampling capacitance 6 are short-circuited is represented by Vr, and in this case, the charges accumulated in the first to fourth sampling capacitances 4 to 7 are calculated for the input terminals Va+ and Va− of the differential amplifier 8 as follows.

$Q(Va+) = Cs(Vap-Vi) + Cs(Vap-Vr)$ $Q(Va-) = Cs(Van-Vr) + Cs(Van-Vi)$

Thereafter, at time t7, the comparison period is ended.

Here, Vap represents a voltage of the positive-polarity input terminal Va+ after comparison, and Van represents a voltage of the negative-polarity input terminal Va− after comparison. A difference between Vap and Van is derived from the above-described expressions and based on the law of conservation of charge as follows.

$Vap-Van = -\frac{1}{2} \times ((Vinp-Vrefp)+(Vrefn-Vinn))$

The influence of an error due to a feedthrough offset caused by a potential difference between Vrefp and Vrefn is eliminated from the inputs of the differential amplifier 8, so that high-precision comparison can be performed in the vicinity of the differential comparison reference voltages Vrefp and Vrefn.

Also, due to the effect of charge redistribution, the differential output signal voltages Vo+ and Vo− respond quickly, so that output settling is substantially determined by the frequency characteristics and drive capability of the differential amplifier 8.

Figure 3:
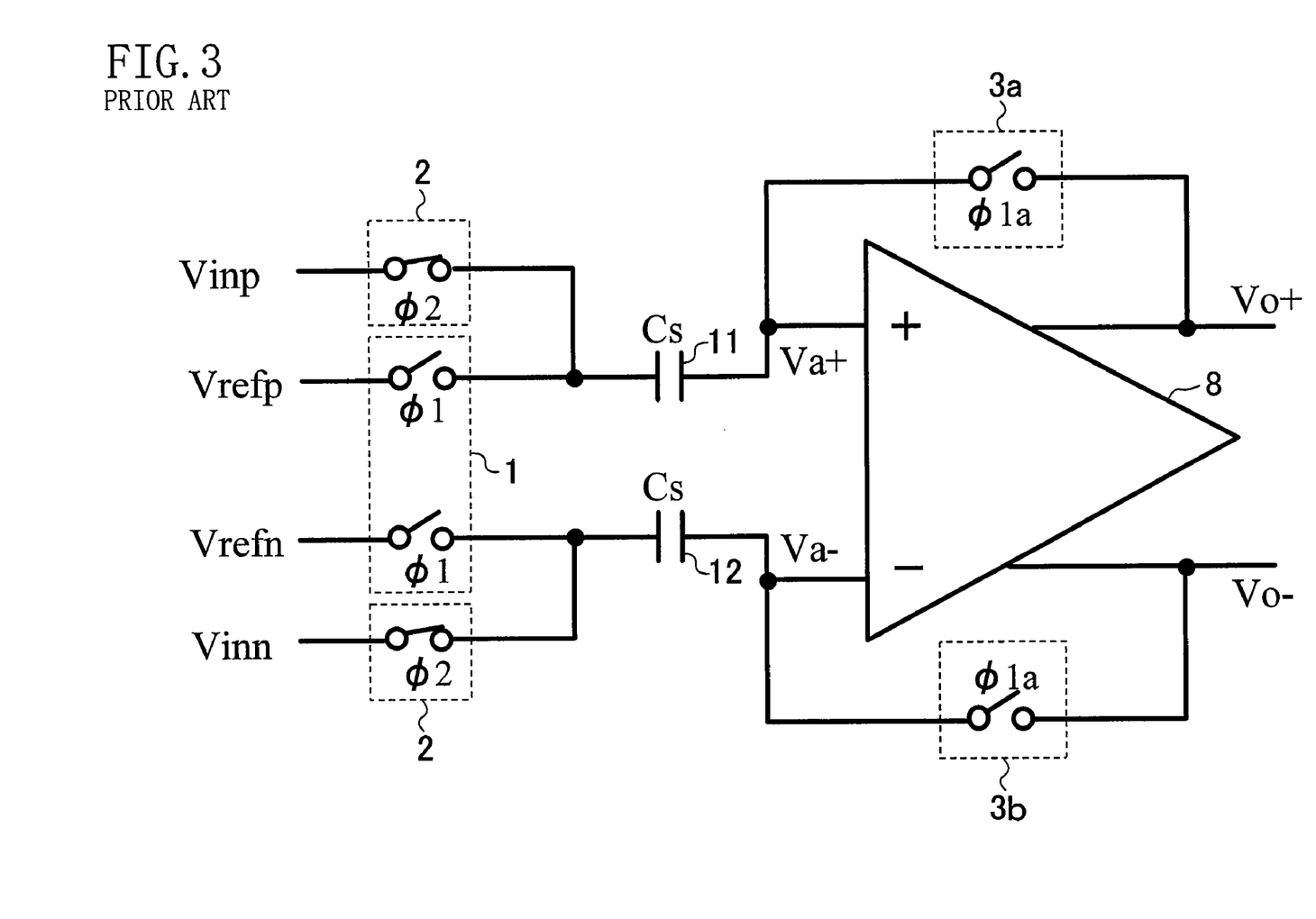
FIG. 3 is a circuit diagram showing an exemplary conventional fully differential comparator.

FIG. 3 shows an exemplary conventional fully differential comparator. In FIG. 3, 1 indicates a pair of sampling switches, 2 indicates a pair of comparison switches, 3a and 3b indicate a pair of reset switches, 11 and 12 indicate a pair of chopper capacitances, and 8 indicates a differential amplifier. The chopper capacitances 11 and 12 are each assumed to have a capacitance value Cs, and first to third switch control signals Φ1, Φ1a and Φ2 are assumed to have the same timing as that of FIG. 2.

In order to clearly describe an advantage of the fully differential comparator of the present invention of FIG. 1, an operation of the conventional fully differential comparator of FIG. 3 under the same conditions will be described. Initially, at time t1, a comparison period is ended, and the comparison switch 2 is opened. Thereby, all of the switches in FIG. 3 are caused to be in the nonconduction state. At time t2, the differential amplifier 8 goes into a reset period, and the reset switches 3a and 3b are closed, so that Va+ and Vo+, and Va− and Vo− are biased by the reset voltage Va. Thereafter, at time t3, the sampling switches 1 are closed, and the positive-polarity comparison reference voltage Vrefp and the negative-polarity comparison reference voltage Vrefn start to be sampled in the positive-polarity chopper capacitance 11 and the negative-polarity chopper capacitance 12, respectively. At time t4, the sampling is ended.

Charges accumulated in the chopper capacitances 11 and 12 at this point in time are calculated under the same conditions as those described above, as follows.

$$Q(Va+)=Cs(Va-Vrefp+\Delta Vp)$$

$$Q(Va-)=Cs(Va-Vrefn+\Delta Vn)$$

(note that $\Delta Vp \neq \Delta Vn$)

Next, at time t5, the reset switches 3a and 3b are opened. At time t6, the comparison switch 2 is closed, and the positive-polarity input signal voltage Vinp and the negative-polarity input signal voltage Vinn start to be applied to the positive-polarity chopper capacitance 11 and the negative-polarity chopper capacitance 12, respectively. At time t7, the comparison is ended.

Charges accumulated in the chopper capacitances 11 and 12 during this comparison period are calculated for the input terminals Va+ and Va− of the differential amplifier 8 as follows.

$$Q(Va+)=Cs(Vap-Vinp)$$

$$Q(Va-)=Cs(Van-Vinn)$$

Here, Vap represents a voltage of the positive-polarity input terminal Va+ after comparison, and Van represents a voltage of the negative-polarity input terminal Va− after comparison. It should be noted that, during the comparison period from time t6 to time t7, since voltage drive is applied from the preceding stage, charge injection due to a feedthrough offset does not occur.

A difference between Vap and Van is derived from the above-described expressions as follows.

$$Vap - Van = (Vinp - Vrefp) + (Vrefn - Vinn) + (\Delta Vp - Vn)$$

Thus, an error due to a feedthrough offset remains at the third term on the right side.

Therefore, according to the configuration of FIG. 3, comparison precision is deteriorated in the vicinity of the differential comparison reference voltages Vrefp and Vrefn. Also, output settling is affected by the current drive capability of the preceding circuit for supplying the differential input signal voltages Vinp and Vinn and a delay due to the time constant of the capacitance values Cs of the chopper capacitances 11 and 12, so that the performance of power consumption and a high-speed operation is deteriorated as compared to the configuration of FIG. 1.

Note that the configuration of FIG. 1 is an example in which the amplitude of the differential input signal voltage is compared with the amplitude of the differential comparison reference voltage. As another exemplary configuration, the sampling capacitances 4 to 7 connected in common to the input terminals Va+ and Va− of the differential amplifier 8 may be combined so that a positive-polarity signal and a negative-polarity signal are invariably combined. In this case, even when a combination of signals sampled in the capacitances 4 to 7 and a combination of capacitance terminals short-circuited by the charge redistribution switches 2a and 2b are changed as appropriate, depending on the signal comparison method, a similar advantage is obtained.

Next, an example in which the comparator technique of the present invention is applied to a fully differential amplifier circuit will be described.

Figure 4:
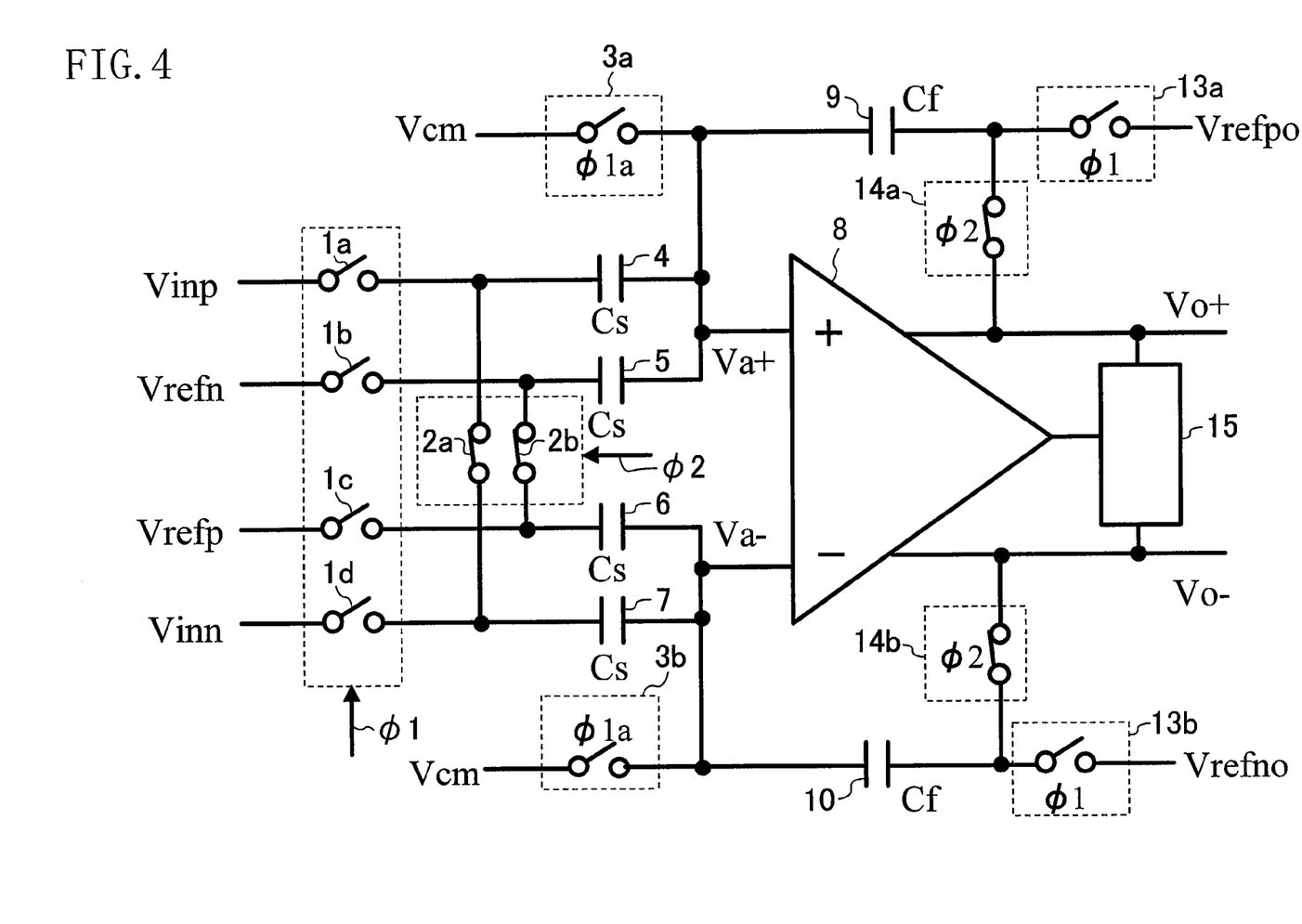
FIG. 4 is a circuit diagram showing an exemplary configuration of a fully differential amplifier circuit according to the present invention.

FIG. 4 shows an exemplary configuration of a fully differential amplifier circuit according to the present invention. Reference symbols shown in FIG. 4 correspond to the same reference symbols in FIG. 1, and first and second feedback capacitances 9 and 10 are added to configure an amplifier circuit. Note that the above-described "comparison period" is renamed "amplification period".

In FIG. 4, a common-mode feedback circuit 15 is provided for adjusting a DC voltage of the differential output signal voltages Vo+ and Vo− of the differential amplifier 8. The positive-polarity input terminal Va+ and the negative-polarity input terminal Va− of the differential amplifier 8 are connected via the first reset switch 3a and the second reset switch 3b, respectively, to an input common voltage Vcm. Also, one end of the first feedback capacitance 9 is connected to the positive-polarity input terminal Va+ of the differential amplifier 8, the other end of the first feedback capacitance 9 is connected via a first output reference voltage application switch 13a to a positive-polarity output reference voltage Vrefpo, and a first feedback switch 14a is interposed between a connection point of the first feedback capacitance 9 and the first output reference voltage application switch 13a and the positive-polarity output terminal Vo+ of the differential amplifier 8. Further, one end of a second feedback capacitance 10 is connected to the negative-polarity input terminal Va− of the differential amplifier 8, the other end of the second feedback capacitance 10 is connected via a second output reference voltage application switch 13b to a negative-polarity output reference voltage Vrefno, and a second feedback switch 14b is interposed between a connection point of the second feedback capacitance 10 and the second output reference voltage application switch 13b and the negative-polarity output terminal Vo− of the differential amplifier 8.

The common-mode feedback circuit 15 comprises a resistance voltage division circuit or a capacitance voltage division circuit, and feeds back to an output stage of the differential amplifier 8 a difference between an intermediate voltage of the differential output signal voltages Vo+ and Vo− and an intermediate voltage of the output reference voltages Vrefpo and Vrefno.

The ON/OFF of the first to fourth sampling switches 1a to 1d and the first and second output reference voltage application switches 13a and 13b is controlled in accordance with the first switch control signal Φ1, the ON/OFF of the first and second reset switches 3a and 3b is controlled in accordance with the second switch control signal Φ1a, and the ON/OFF of the first and second charge redistribution switches 2a and 2b and the first and second feedback switches 14a and 14b is controlled in accordance with the third switch control signal Φ2.

The first and second feedback capacitances 9 and 10 have a capacitance value represented by Cf, and calculation is performed for the input terminals Va+ and Va− of the differential amplifier 8 based on the law of conservation of charge under sampling error conditions similar to those described above to obtain the following.

$$(Vop-Vrefpo)+(Vrefno-Von)=Cs/Cf\times((Vinp-Vrefp)+(Vrefn-Vinn))$$

Thus, it is found that the influence of a feedthrough offset is eliminated. In other words, an error due to an offset is not amplified when a small signal is amplified. In addition, by setting the differential output reference voltages Vrefpo and Vrefno, a wide dynamic range can be achieved.

Although the input common voltage Vcm is used as a reset input voltage for the differential amplifier 8 in FIG. 4, an arrangement which is connected to Vo+ and Vo− and biases Vo+ and Vo− using the reset voltage Va may be employed instead of the common-mode feedback circuit 15. In this case, an equivalent operation can be achieved.

Also, the capacitance values Cs of the first to fourth sampling capacitances 4 to 7 and the capacitance values Cf of the first and second feedback capacitances 9 and 10 may each be variable.

INDUSTRIAL APPLICABILITY

As described above, the present invention is useful for a processing circuit in an analog-digital interface section in a field which requires fully differential analog signal processing with high-speed, a wide dynamic range, and high-precision, and is applicable to a wide range of applications. Examples of the applications include a high-performance surveillance camera, an in-car camera, and the like.

The invention claimed is:

1. A fully differential comparator comprising:
a first to a fourth sampling switch which receive a switch control signal indicating a reset period and a comparison period and are in a conduction state during the reset period, wherein the reset period and the comparison period do not overlap each other;
a first to a fourth sampling capacitance to one ends of which a first to a fourth input voltage are separately applied via the first to fourth sampling switches, respectively, during the reset period;
a differential amplifier having a first input terminal to which the other ends of any two of the first to fourth sampling capacitances are connected in common, and a second input terminal to which the other ends of the other two sampling capacitances are connected in common;
a first charge redistribution switch which causes, during the comparison period, one end connected to any of the first to fourth sampling switches of one of the two sampling capacitances connected to the first input terminal and one end connected to any of the first to fourth sampling switches of one of the two sampling capacitances connected to the second input terminal, to be in a conduction state; and
a second charge redistribution switch which causes, during the comparison period, one end connected to any of the first to fourth sampling switches of the other of the two sampling capacitances connected to the first input terminal and one end connected to any of the first to fourth sampling switches of the other of the two sampling capacitances connected to the second input terminal, to be in a conduction state,
wherein the differential amplifier outputs, during the comparison period, a first output signal and a second output signal, depending on a difference between a voltage level of the first input terminal of the differential amplifier and a voltage level of the second input terminal of the differential amplifier.

2. The fully differential comparator of claim 1, wherein
a voltage having one polarity of two input voltages defining a voltage amplitude of a differential input signal of the first to fourth input voltages is applied to one end of one of the two sampling capacitances connected in common to the first input terminal of the differential amplifier during the reset period,
a voltage having one polarity of two input voltages defining a voltage amplitude of a differential comparison reference of the first to fourth input voltages is applied to one end of the other of the two sampling capacitances connected in common to the first input terminal of the differential amplifier during the reset period,
the polarities of the voltages applied to the two sampling capacitances connected in common to the first input terminal are opposite to each other,
a voltage having the other polarity of the two input voltages defining the voltage amplitude of the differential input signal of the first to fourth input voltages is applied to one end of one of the two sampling capacitances connected in common to the second input terminal of the differential amplifier during the reset period,
a voltage having the other polarity of the two input voltages defining the voltage amplitude of the differential comparison reference of the first to fourth input voltages is applied to one end of the other of the two sampling capacitances connected in common to the second input terminal of the differential amplifier during the reset period, and
the polarities of the voltages applied to the two sampling capacitances connected in common to the second input terminal are opposite to each other.

3. The fully differential comparator of claim 1, wherein
the first to fourth sampling capacitances substantially all have the same capacitance value.

4. The fully differential comparator of claim 3, further comprising:
a first reset switch having two ends, wherein one of the two ends is connected to the first input terminal of the differential amplifier and the other end is connected to a first output terminal of the differential amplifier, the first output signal being output through the first output terminal, and the first reset switch is in a conduction state during the reset period and is in a nonconduction state during the comparison period; and
a second reset switch having two ends, wherein one of the two ends is connected to the second input terminal of the differential amplifier and the other end is connected to a second output terminal of the differential amplifier, the second output signal being output through the second output terminal, and the second reset switch is in a conduction state during the reset period and is in a nonconduction state during the comparison period,
wherein, during the reset period, the first input terminal and the second input terminal are biased by a uniquely determined voltage.

5. The fully differential comparator of claim 4, wherein
during the reset period, after the first and second reset switches go into the conduction state, the first to fourth sampling switches go into a conduction state, and after the first to fourth sampling switch go into a nonconduction state, the first and second reset switches go into the nonconduction state.

6. A fully differential amplifier circuit comprising:
a first to a fourth sampling switch which receive a switch control signal indicating a reset period and an amplification period and are in a conduction state during the reset period, wherein the reset period and the amplification period do not overlap each other;

a first to a fourth sampling capacitance to one ends of which a first to a fourth input voltage are applied via the first to fourth sampling switches, respectively, during the reset period;

a differential amplifier having a first input terminal to which the other ends of any two sampling capacitances of the first to fourth sampling capacitances are connected in common, and a second input terminal to which the other ends of the other two sampling capacitances are connected in common;

a first charge redistribution switch which causes, during the amplification period, one end connected to any of the first to fourth sampling switches of one of the two sampling capacitances connected to the first input terminal and one end connected to any of the first to fourth sampling switches of one of the two sampling capacitances connected to the second input terminal, to be in a conduction state;

a second charge redistribution switch which causes, during the amplification period, one end connected to any of the first to fourth sampling switches of the other of the two sampling capacitances connected to the first input terminal and one end connected to any of the first to fourth sampling switches of the other of the two sampling capacitances connected to the second input terminal, to be in a conduction state;

a first feedback capacitance having a first terminal connected to the first input terminal of the differential amplifier and a second terminal connected to a first output terminal of the differential amplifier; and a second feedback capacitance having a first terminal connected to the second input terminal of the differential amplifier and a second terminal connected to a second output terminal of the differential amplifier, wherein, during the amplification period, the differential amplifier outputs a first output signal to the first output terminal of the differential amplifier and a second output signal to the second output terminal of the differential amplifier, depending on a difference between a voltage level of the first input terminal of the differential amplifier and a voltage level of the second input terminal of the differential amplifier.

7. The fully differential amplifier circuit of claim 6, wherein a voltage having one polarity of two input voltages defining a voltage amplitude of a differential input signal of the first to fourth input voltages is applied to one end of one of the two sampling capacitances connected in common to the first input terminal of the differential amplifier during the reset period, a voltage having one polarity of two input voltages defining a voltage amplitude of a differential comparison reference of the first to fourth input voltages is applied to one end of the other of the two sampling capacitances connected in common to the first input terminal of the differential amplifier during the reset period, the polarities of the voltages applied to the two sampling capacitances connected in common to the first input terminal are opposite to each other, a voltage having the other polarity of the two input voltages defining the voltage amplitude of the differential input signal of the first to fourth input voltages is applied to one end of one of the two sampling capacitances connected in common to the second input terminal of the differential amplifier during the reset period, a voltage having the other polarity of the two input voltages defining the voltage amplitude of the differential comparison reference of the first to fourth input voltages is applied to one end of the other of the two sampling capacitances connected in common to the second input terminal of the differential amplifier during the reset period, and the polarities of the voltages applied to the two sampling capacitances connected in common to the second input terminal are opposite to each other.

8. The fully differential amplifier circuit of claim 6, wherein the first to fourth sampling capacitances substantially all have the same capacitance value.

9. The fully differential amplifier circuit of claim 8, further comprising:

a first reset switch having two ends, wherein one of the two ends is connected to the first input terminal of the differential amplifier, and the first reset switch is in a conduction state during the reset period and is in a nonconduction state during the amplification period;

a second reset switch having two ends, wherein one of the two ends is connected to the second input terminal of the differential amplifier, and the second reset switch is in a conduction state during the reset period and is in the nonconduction state during a amplification period; and a common-mode feedback circuit which adjusts a DC voltage of differential output signal voltages defined by the first and second output signals, wherein an input common voltage is applied to the other end of the first reset switch and the other end of the second reset switch.

10. The fully differential amplifier circuit of claim 9, further comprising:

a first feedback switch interposed between the second terminal of the first feedback capacitance and the first output terminal of the differential amplifier, wherein the first feedback switch is in a nonconduction state during the reset period and is in a conduction state during the amplification period;

a first output reference voltage application switch having two ends, wherein one of the two ends is connected to a connection point of the first feedback capacitance and the first feedback switch, and a first output reference voltage is applied to the other end, and the first output reference voltage application switch is in a conduction state during the reset period and is in a nonconduction state during the amplification period;

a second feedback switch interposed between the second terminal of the second feedback capacitance and the second output terminal of the differential amplifier, wherein the second feedback switch is in a nonconduction state during the reset period and is in the conduction state during the amplification period; and a second output reference voltage application switch having two ends, wherein one of the two ends is connected to a connection point between the second feedback capacitance and the second feedback switch, and a second output reference voltage is applied to the other end, and the second output reference voltage application switch is in a conduction state during the reset period and is in a nonconduction state during the amplification period.

11. The fully differential amplifier circuit of claim 10, wherein a signal amplification factor defined by the first and second output signals of the differential amplifier is determined by a ratio of a capacitance value of the first to fourth sampling capacitance to a capacitance value of the first and second feedback capacitances.

12. The fully differential amplifier circuit of claim 10, wherein during the reset period, after the first and second reset switches go into the conduction state, the first to fourth sampling switches and the first and second output reference voltage application switches go into a conduction state, and after the first to fourth sampling switches and the first and second output reference voltage application switches go into a nonconduction state, the first and second reset switches go into the nonconduction state.

* * * * *